(12) United States Patent
Yen et al.

(10) Patent No.: US 10,825,597 B2
(45) Date of Patent: Nov. 3, 2020

(54) HELICAL STACKED INTEGRATED TRANSFORMER AND INDUCTOR

(71) Applicant: REALTEK SEMICONDUCTOR CORPORATION, Hsinchu (TW)

(72) Inventors: Hsiao-Tsung Yen, Hsinchu (TW); Yuh-Sheng Jean, Hsinchu County (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 515 days.

(21) Appl. No.: 15/291,748

(22) Filed: Oct. 12, 2016

(65) Prior Publication Data

US 2017/0117079 A1    Apr. 27, 2017

(30) Foreign Application Priority Data

Oct. 23, 2015  (TW) .............................. 104134799 A

(51) Int. Cl.
  *H01F 27/28*    (2006.01)
  *H01F 21/12*    (2006.01)
  (Continued)

(52) U.S. Cl.
  CPC ......... *H01F 21/12* (2013.01); *H01F 17/0013* (2013.01); *H01F 19/04* (2013.01);
  (Continued)

(58) Field of Classification Search
  CPC .............................. H01F 27/2804; H01F 21/12
  See application file for complete search history.

(56) References Cited

U.S. PATENT DOCUMENTS

| 6,153,885 A * | 11/2000 | Kendall | ................. H01J 49/20 250/396 ML |
|---|---|---|---|
| 6,603,383 B2 | 8/2003 | Gevorgian et al. | |

(Continued)

FOREIGN PATENT DOCUMENTS

| CN | 102403097 A | 4/2012 |
| CN | 103779320 | 5/2014 |
| CN | 104769687 A | 7/2015 |

OTHER PUBLICATIONS

USPTO "Final Office Action" dated Aug. 9, 2018, U.S.A. OA letter of U.S. Appl. No. 15/150,126 dated Aug. 9, 2018. U.S. Pat. No. 6,653,910 B2 and US 2013/0141203 A1 are cited by the OA letter.

(Continued)

*Primary Examiner* — Elvin G Enad
*Assistant Examiner* — Malcolm Barnes
(74) *Attorney, Agent, or Firm* — WPAT, PC

(57) ABSTRACT

A helical stacked integrated transformer formed by a first inductor and a second inductor includes a first helical coil that has a first outer coil and a first inner coil, a second helical coil that shares an overlapped region with the first helical coil and has a second outer coil and a second inner coil, and a connection structure that connects the first helical coil and the second helical coil. The first inner coil is located inside the first outer coil and the second inner coil is located inside the second outer coil. The first inductor includes a part of the first helical coil and a part of the second helical coil. The second inductor includes a part of the first helical coil and a part of the second helical coil.

12 Claims, 13 Drawing Sheets

(51) Int. Cl.
  *H01F 19/04* (2006.01)
  *H01F 17/00* (2006.01)
  *H01L 23/64* (2006.01)
  *H01F 27/29* (2006.01)

(52) U.S. Cl.
  CPC ......... *H01F 27/28* (2013.01); *H01F 27/2804* (2013.01); *H01F 27/29* (2013.01); *H01L 23/645* (2013.01); *H01F 2027/2809* (2013.01)

(56) References Cited

U.S. PATENT DOCUMENTS

| | | | |
|---|---|---|---|
| 6,653,910 B2 | 11/2003 | Escalera et al. | |
| 6,943,636 B2* | 9/2005 | Moore | H03L 7/099 331/108 D |
| 8,183,971 B2* | 5/2012 | Le Guillou | H03B 5/1841 336/200 |
| 8,198,970 B2 | 6/2012 | Choi et al. | |
| 8,536,969 B2 | 9/2013 | Nam et al. | |
| 9,070,506 B2 | 6/2015 | Anderson et al. | |
| 9,312,060 B2 | 4/2016 | Godoy et al. | |
| 2002/0101322 A1* | 8/2002 | Liu | H01F 17/0013 336/223 |
| 2002/0113682 A1* | 8/2002 | Gevorgian | H01F 17/0013 336/200 |
| 2004/0075521 A1* | 4/2004 | Yu | H01F 5/003 336/200 |
| 2004/0195651 A1* | 10/2004 | Zhang | H01F 17/0006 257/531 |
| 2005/0024178 A1* | 2/2005 | Ancey | H01F 17/0006 336/200 |
| 2005/0068146 A1* | 3/2005 | Jessie | H01F 17/0006 336/200 |
| 2006/0033587 A1* | 2/2006 | Cabanillas | H03B 5/1218 331/108 C |
| 2006/0097811 A1* | 5/2006 | Nakamura | H03B 5/1215 331/167 |
| 2007/0247269 A1* | 10/2007 | Papananos | H01F 27/2804 336/200 |
| 2008/0191829 A1* | 8/2008 | Lee | H01F 17/0006 336/170 |
| 2008/0284552 A1 | 11/2008 | Lim et al. | |
| 2009/0201101 A1* | 8/2009 | Kossel | H03H 7/185 333/174 |
| 2009/0284339 A1* | 11/2009 | Choi | H01F 17/0013 336/200 |
| 2009/0289727 A1* | 11/2009 | El Rai | H03B 5/1847 331/46 |
| 2009/0315799 A1* | 12/2009 | Eray | G06K 19/07749 343/788 |
| 2010/0019857 A1 | 1/2010 | McMorrow et al. | |
| 2010/0066473 A1* | 3/2010 | Fahs | H01F 17/0006 336/30 |
| 2010/0117737 A1* | 5/2010 | Kondo | H03F 1/0272 330/276 |
| 2011/0102093 A1* | 5/2011 | El Rai | H03B 5/1841 331/117 FE |
| 2011/0148733 A1* | 6/2011 | Fahs | H01F 17/0006 343/859 |
| 2011/0248811 A1* | 10/2011 | Kireev | H01L 23/5227 336/200 |
| 2012/0154073 A1* | 6/2012 | Lee | H01F 21/12 333/174 |
| 2012/0223796 A1* | 9/2012 | Huang | H01F 21/12 336/142 |
| 2013/0141203 A1 | 6/2013 | Yoon et al. | |
| 2014/0070913 A1* | 3/2014 | Beer | H01F 27/2804 336/192 |
| 2014/0077919 A1* | 3/2014 | Godoy | H01F 27/006 336/220 |
| 2015/0091687 A1* | 4/2015 | Valentin | H01F 17/0013 336/200 |
| 2015/0310980 A1 | 10/2015 | Yen et al. | |
| 2015/0364241 A1* | 12/2015 | Groves | H01F 41/041 336/200 |
| 2016/0149543 A1* | 5/2016 | Anderson | H03F 1/0227 330/295 |
| 2016/0276097 A1* | 9/2016 | Lewis | H03F 3/211 |
| 2018/0151287 A1 | 5/2018 | Yosui et al. | |

OTHER PUBLICATIONS

China Patent Office "Office Action" dated Aug. 16, 2018, China. OA letter of counterpart CN application of U.S. Appl. No. 15/150,126 dated Aug. 16, 2018. Summary of the OA letter of item 5: The cited reference 3 (CN 104769687 A) anticipates claims 1-2 and 11, and renders claims 3-10, and 12-24 obvious. CN 104769687 A( also published as U.S. Pat. No. 9,312,060B2) is cited by the OA letter.
OA letter of U.S. Appl. No. 15/150,126 dated Dec. 11, 2018.
OA letter of the US application (U.S. Appl. No. 15/293,101) dated Jun. 12, 2019.
Office action from the China patent office for counterpart application No. 201510727873.7 dated Sep. 21, 2017.
U.S. Appl. No. 15/150,126.
CN 103779320 US counterpart: US Pub. No. 20140070913.

* cited by examiner

HELICAL STACKED INTEGRATED TRANSFORMER AND INDUCTOR

BACKGROUND OF THE INVENTION

1. Field of the Invention

The present invention relates to a transformer and an inductor, especially to a helical stacked integrated transformer and a helical stacked integrated inductor.

2. Description of Related Art

Inductors and transformers are important elements in radio frequency integrated circuits to implement single-ended to differential signal conversion, signal coupling and impedance matching. As System-on-chips (SoC) become the mainstream of integrated circuits, integrated inductors and integrated transformers gradually substitute conventional discrete elements and are commonly applied to radio frequency integrated circuits. However, inductors and transformers in integrated circuits often take up large areas; therefore, it becomes an important issue to reduce the areas of inductors and transformers in integrated circuits without degrading element performances, such as inductance, quality factor (Q), and coupling coefficient (K).

SUMMARY OF THE INVENTION

In view of the issues of the prior art, an object of the present invention is to provide a helical stacked integrated transformer and a helical stacked integrated inductor so as to reduce component areas and improve component performances.

The present invention discloses a helical stacked integrated transformer, formed by a first inductor and a second inductor and including a first helical coil, a second helical coil and a connecting structure. The first helical coil includes a first outer coil and a first inner coil. The first inner coil is located inside the first outer coil. The second helical coil shares an overlapped region with the first helical coil and includes a second outer coil and a second inner coil. The second inner coil is located inside the second outer coil. The connecting structure connects the first helical coil and the second helical coil. The first inductor includes a part of the first helical coil and a part of the second helical coil. The second inductor includes a part of the first helical coil and a part of the second helical coil.

The present invention also discloses a helical stacked integrated inductor, formed by a first inductive unit and a second inductive unit and including a first helical coil, a second helical coil and a connecting structure. The first helical coil includes a first outer coil and a first inner coil. The first inner coil is located inside the first outer coil and includes a first terminal and a second terminal The second helical coil shares an overlapped region with the first helical coil and includes a second outer coil and a second inner coil. The second inner coil is located inside the second outer coil and includes a third terminal. The connecting structure connects the first helical coil and the second helical coil. The first inductive unit includes a part of the first helical coil and a part of the second helical coil and utilizes the first terminal and the third terminal as its two terminals. The second inductive unit includes a part of the first helical coil and a part of the second helical coil and utilizes the second terminal and the third terminal as its two terminals.

The helical stacked integrated transformer and helical stacked integrated inductor of the present invention have integrated symmetry structures to provide two highly symmetric inductors, and are thus more suitable for passive components in integrated circuits.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

Figure 1A:
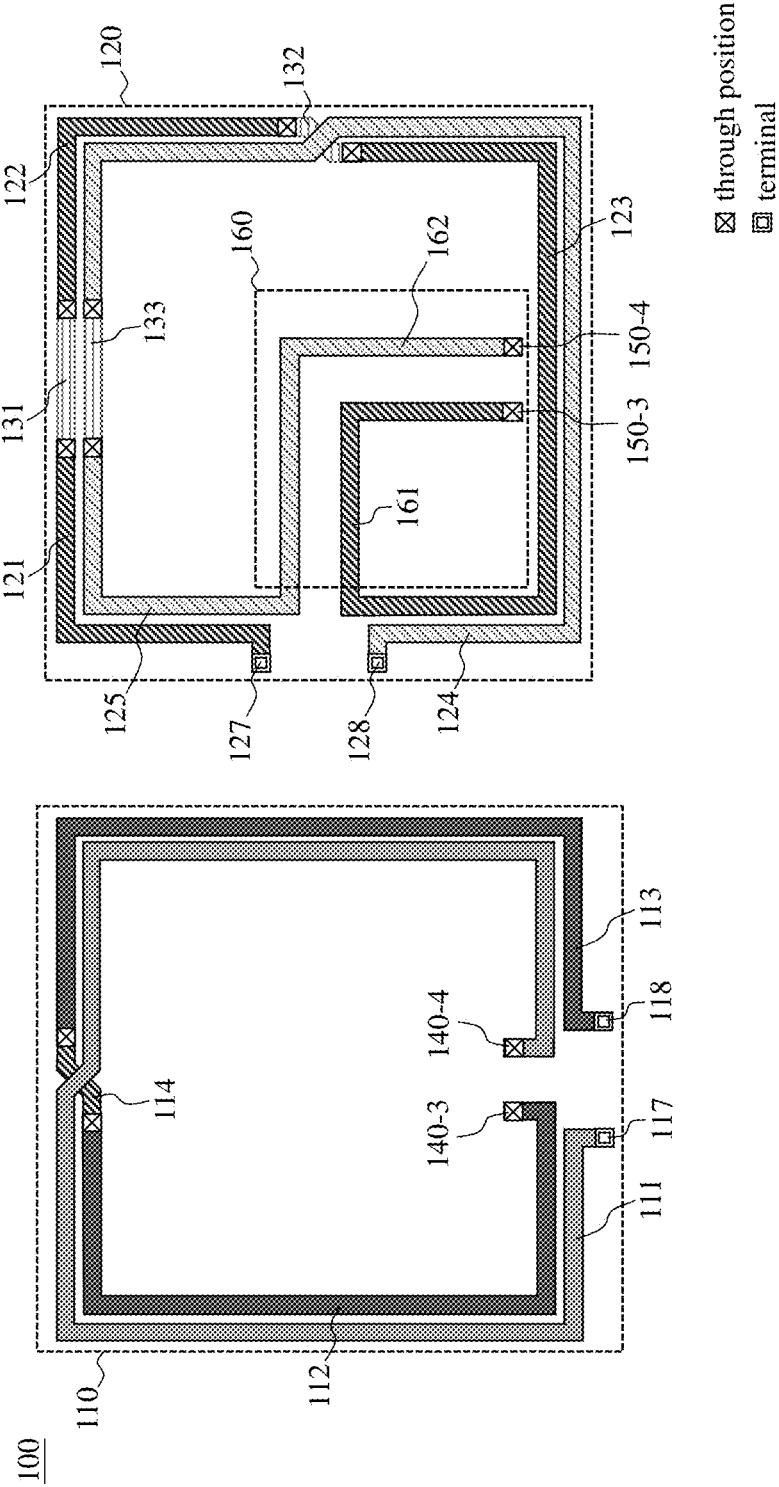
FIG. 1A illustrates a structure of a helical stacked integrated transformer according to an embodiment of the present invention.

FIG. 1A illustrates a structure of a helical stacked integrated transformer according to an embodiment of the present invention. The helical stacked integrated transformer 100 includes a helical coil 110 and a helical coil 120. The opening of the helical coil 110 and the opening of the helical coil 120 are perpendicular to each other. Most metal segments of the helical coil 110 are located in the first metal layer of the semiconductor structure. Most metal segments of the helical coil 120 are located in the second metal layer of the semiconductor structure. The helical coil 110 includes a terminal 117 and a terminal 118, and further includes a metal segment 111, a metal segment 112, a metal segment 113 and a metal segment 114. The left half of the metal segment 111 and the metal segment 113 together form the outer coil of the helical coil 110, and the right half of the metal segment 111 and the metal segment 112 together form the inner coil of the helical coil 110. The helical coil 120 includes a terminal 127 and a terminal 128, and further includes a metal segment 121, a metal segment 122, a metal segment 123, a metal segment 124, a metal segment 125, a metal segment 131, a metal segment 132 and a metal segment 133. The helical coil 120 includes an outer coil and an inner coil as well. The outer coil of the helical coil 120 includes the metal segment 121, the metal segment 131, the metal segment 122 and the lower part of the metal segment 124. The inner coil of the helical coil 120 includes the metal segment 125, the metal segment 133, an upper part of the metal segment 124 and the metal segment 123.

In the semiconductor structure, the metal segment 111, the metal segment 112 and the metal segment 113 are located in the first metal layer. The metal segment 114, the metal segment 121, the metal segment 122, the metal segment 123, the metal segment 124 and the metal segment 125 are located in the second metal layer. The metal segment 131, the metal segment 132 and the metal segment 133 are located in a third metal layer. The three metal layers are substantially parallel to one another. The metal segment 114 connects the metal segment 112 and the metal segment 113 via the through structures (located in the through positions in the figures) perpendicular to the metal layers. Therefore, the metal segment 114 can be deemed a part of the helical coil 110 Similarly, although the metal segment 131, the metal segment 132 and the metal segment 133 are located in the third metal layer, they respectively connect the metal segment 121 with the metal segment 122, the metal segment 122 with the metal segment 123, and the metal segment 124 with the metal segment 125 via multiple through structures. Therefore, the metal segment 131, the metal segment 132 and the metal segment 133 can be deemed as a part of the helical coil 120. The helical coil 110 and the helical coil 120 are a stacked structure, with the outer coils of both substantially overlapped and the inner coils of both substantially overlapped. That is, the helical coil 110 and the helical coil 120 do not contact each other except for the through positions, but share an overlapped region in the semiconductor structure.

The helical stacked integrated transformer 100 further includes a connecting structure 160. The connecting structure 160 is located within the overlapped region of the helical coil 110 and the helical coil 120. The connecting structure 160 includes a metal segment 161 and a metal segment 162. Note that in this embodiment, although the metal segment 161 is connected with the metal segment 123 and the metal segment 162 is connected with the metal segment 125, this invention specifically defines the metal segment 161 and the metal segment 162 as the connecting structure 160 to be distinguished from the inner coil. As such, the inner coil of the helical coil is explicitly defined to facilitate the description of this invention. The connecting structure 160 is mainly for connecting the inner coil of the helical coil 110 and the inner coil of the helical coil 120, and is thus located within the overlapped range of the helical coil 110 and the helical coil 120. In this embodiment, since the connecting structure 160 is located in the second metal layer, the metal segment 161 is directly connected with the metal segment 123, the metal segment 162 is directly connected with the metal segment 125, and the metal segment 161 and the metal segment 162 are respectively connected with the metal segment 112 and the metal segment 111 in the first metal layer via the through structures at the through position 150-3 and the through position 150-4 (the through position 150-3 corresponds to the through position 140-3 and the through position 150-4 corresponds to the through position 140-4). So, actually the metal segment 112 and the metal segment 161 are connected and the metal segment 111 and the metal segment 162 are connected. In another embodiment, the connecting structure 160 can be implemented in a different metal layer and be connected with metal segments in different layers via the through structures.

By analyzing the structure of the helical stacked integrated transformer 100, the helical stacked integrated transformer 100 in fact includes two inductors. The first inductor utilizes the terminal 117 as one of its terminals and the terminal 128 as the other. The first inductor mainly includes the metal segment 111, the metal segment 125, the metal segment 133 and the metal segment 124. In short, the first inductor includes the left half of the outer coil and the right half of the inner coil of the helical coil 110, and the upper half of the inner coil and the lower half of the outer coil of the helical coil 120 (i.e., the metal segments in light grey in FIG. 1A). Similarly, the second inductor utilizes the terminal 118 as one of its terminals and the terminal 127 as the other. The second inductor mainly includes the metal segment 113, the metal segment 114, the metal segment 112, the metal segment 123, the metal segment 132, the metal segment 122, the metal segment 131 and the metal segment 121. In short, the second inductor includes the right half of the outer coil and the left half of the inner coil of the helical coil 110, and the lower half of the inner coil and the upper half of the outer coil of the helical coil 120 (i.e., the metal segments in dark grey in FIG. 1A). The helical stacked integrated transformer 100 realizes the functions of a transformer through the coupling of the two inductors.

Figure 1B:
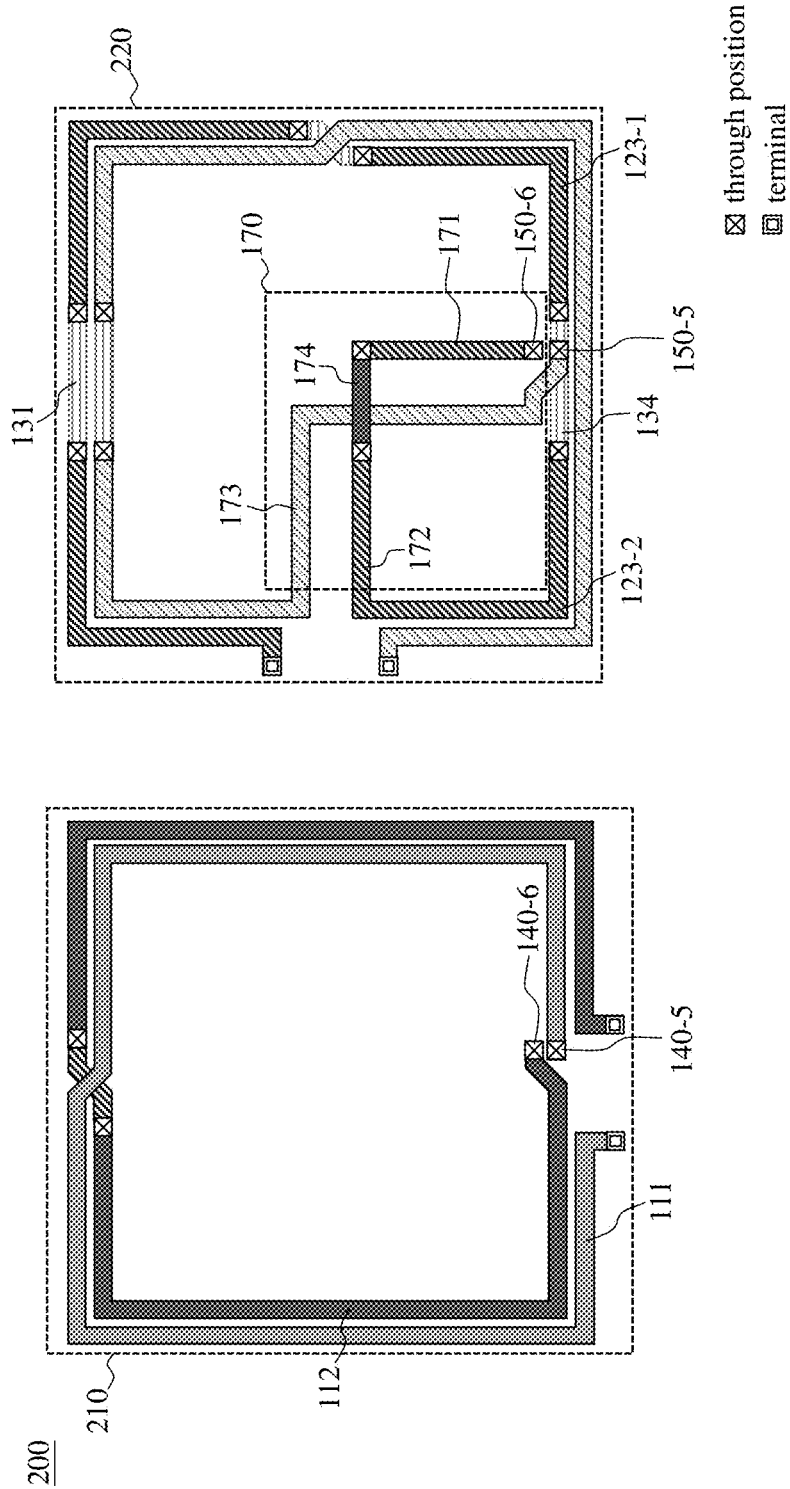
FIG. 1B illustrates a structure of the helical stacked integrated transformer according to another embodiment of this invention.

FIG. 1B illustrates a structure of the helical stacked integrated transformer according to another embodiment of this invention. Basically, the helical stacked integrated transformer 200 is similar to the helical stacked integrated transformer 100 in including 2 helical coils (i.e., the helical coil 210 and the helical coil 220), except that the metal segment 123 of the helical coil 120 is broken down into three metal segments in the helical coil 220, i.e., the metal segment 123-1 (the second metal layer), the metal segment 123-2 (the second metal layer) and the metal segment 134 (the third metal layer). In addition, the connecting structure 170 of the helical stacked integrated transformer 200 is slightly different from the connecting structure 160. The connecting structure 170 includes a metal segment 171, a metal segment 172, a metal segment 173 and a metal segment 174. The metal segment 174 is located in the first metal layer whereas other metal segments are located in the second metal layer. In other words, the connecting structure 170 in this embodiment is located in more than one metal layer. The through position 140-5 corresponds to the through position 150-5 and the through position 140-6 corresponds to the through position 150-6, such that the metal segment 112 is connected with the metal segment 171 via the through structure and the metal segment 111 is connected with the metal segment 173 via the through structure. Although the connecting structures of the helical stacked integrated transformer 100 and the helical stacked integrated transformer 200 are different, the configurations of the first inductor and the second inductor in the helical stacked integrated transformer 100 and the helical stacked integrated transformer 200 are substantially identical.

Figure 1C:
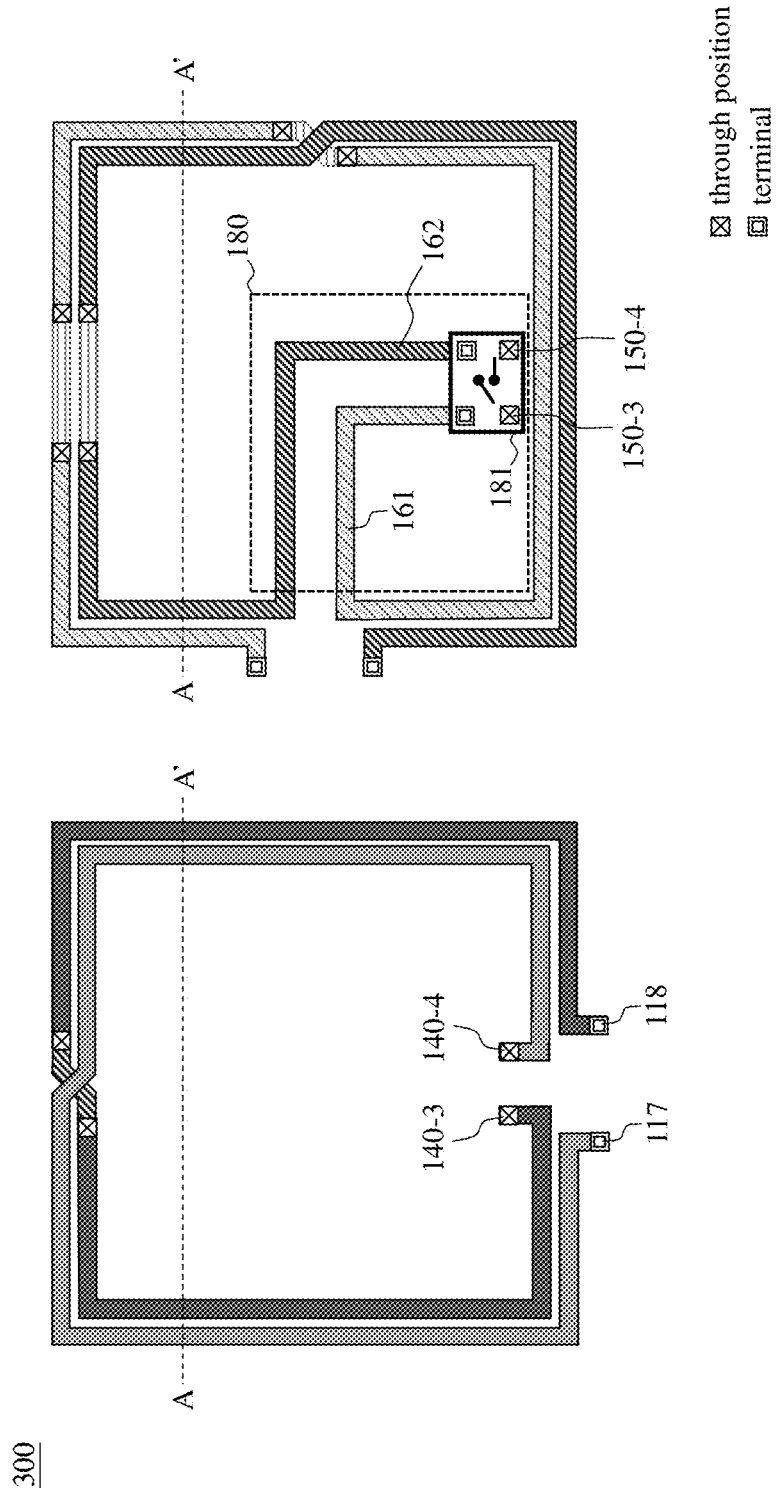
FIG. 1C illustrates a structure of the helical stacked integrated transformer according to another embodiment of this invention.
Figure 1D:
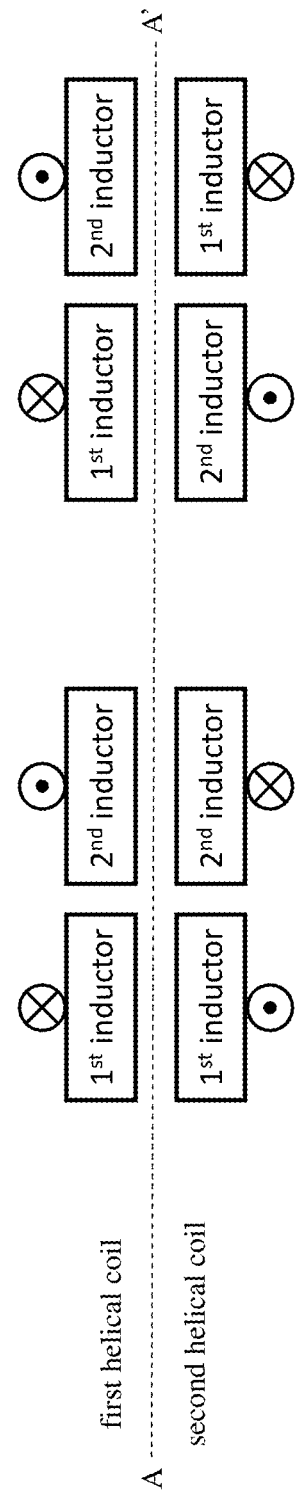
FIGS. 1D and 1E depict cross-sectional views of the helical stacked integrated transformer corresponding to different switching states of the switch module in FIG. 1C.
Figure 1E:
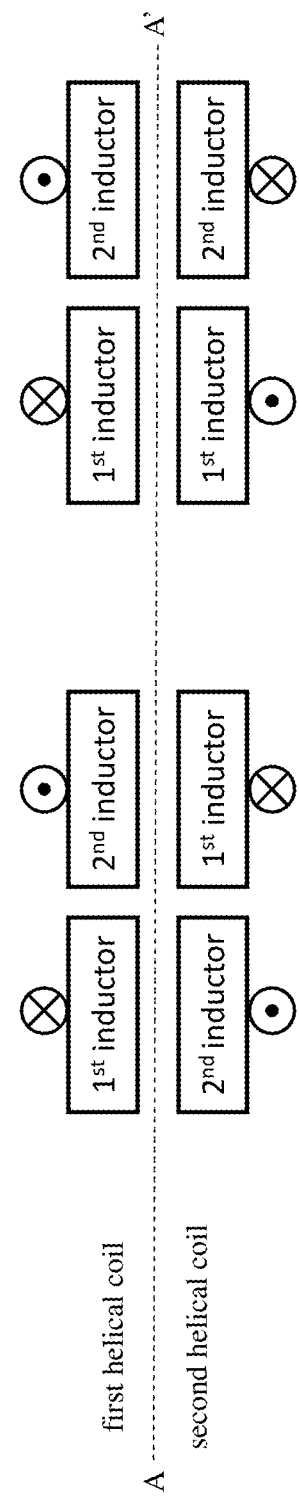

FIG. 1C illustrates a structure of the helical stacked integrated transformer according to another embodiment of this invention. In this embodiment, in addition to the metal segment 161 and the metal segment 162, the connecting structure 180 of the helical stacked integrated transformer 300 further includes the switch module 181. The switch module 181 decides how the through position 150-3 and the through position 150-4 are connected with the terminals of the metal segment 161 and the metal segment 162 by controlling the multiple switching units provided therein. For example, in a first switching state, the through position 150-3 and the through position 150-4 are respectively connected with the terminals of the metal segment 162 and the metal segment 161; in a second switching state, the through position 150-3 and the through position 150-4 are respectively connected with the terminals of the metal segment 161 and the metal segment 162. In one exemplary embodiment, the switch module 181 includes 4 switching units to carry out the above switching mechanism. For example, the switching units can be implemented by Metal-Oxide-Semiconductor Field-Effect Transistors (MOSEFT). FIG. 1D and FIG. 1E are cross-sectional views of the helical stacked integrated transformer corresponding to different switching states of the switch module in FIG. 1C. FIG. 1D and FIG. 1E are made with respect to the cross section A-A' in FIG. 1C. The current directions of the first inductor and second inductor in the inner coil and the outer coil are also shown in this figure (here, the currents are assumed to flow into the two inductors via the terminal 117 and the terminal 118, respectively). FIG. 1D corresponds to the aforementioned first switching state, and FIG. 1E corresponds to the aforementioned second switching state. It is shown that, the switching of the switch module 181 causes the current directions in the two inductors to change, thus causing not only the self-inductance and the mutual inductance of the two inductors but also the inductance values of respective inductors to change In other words, in practice, the inductance values of the two inductors of the helical stacked integrated transformer 300 can be adjusted through the switch module 181. It is also shown that, in this embodiment, the first metal layer in which the first helical coil is located is above the second metal layer in which the second helical coil is located. For example, the first and the second metal layers are the redistribution layer (RDL) and the Ultra-Thick Metal (UTM) layer of the semiconductor structure, respectively, and the third metal layer in which the metal segment 131, the metal segment 132 and the metal segment 133 are located is implemented in a metal layer under the UTM layer.

Figures 2A, 2B:
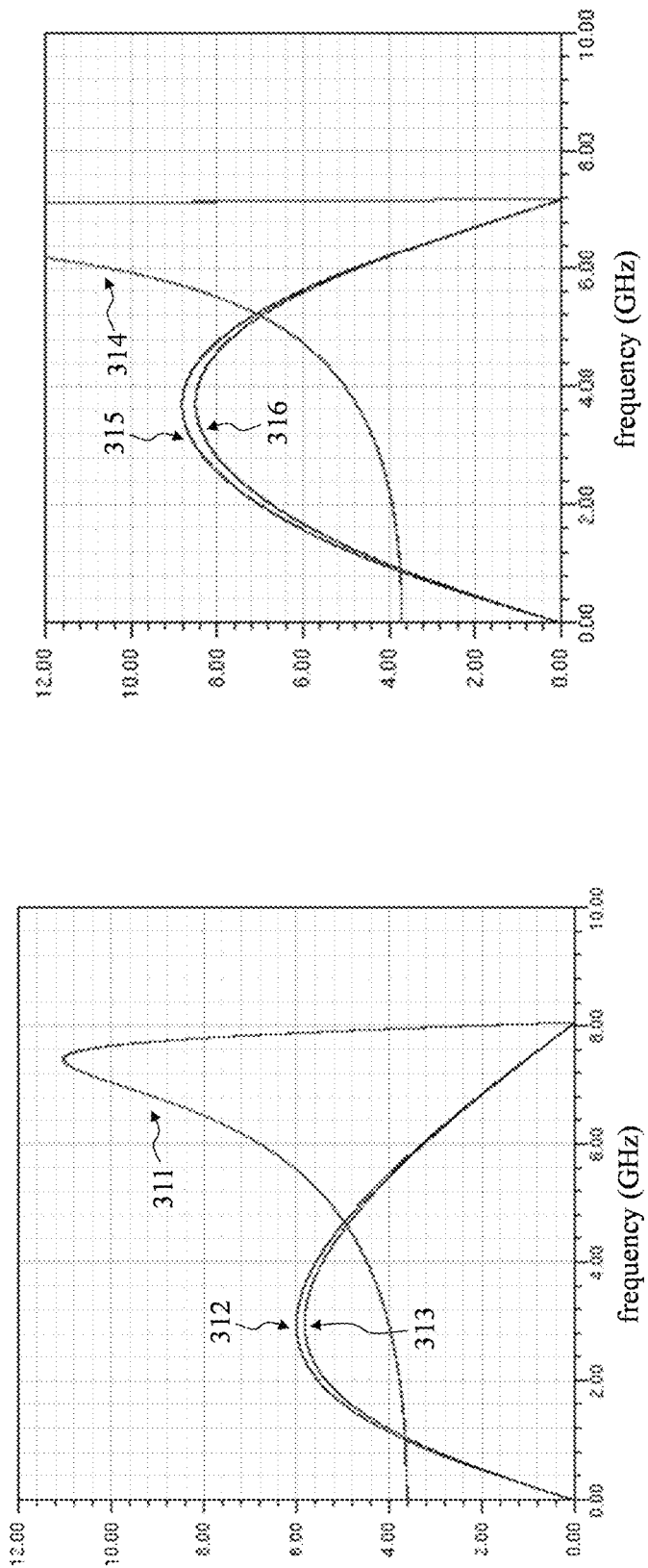
FIGS. 2A and 2B illustrate simulation results of the inductance value and the quality factor (Q) of the helical stacked integrated transformer 200 of FIG. 1B.

FIG. 2A and FIG. 2B show simulation results of the inductance value and the quality factor (Q) of the helical stacked integrated transformer 200 of FIG. 1B, where the linewidth is $4\sqrt[3]{}$ m, the number of turns is 4, the inner diameter is $38\sqrt[3]{}$ m and the line distance is $2\sqrt[3]{}$ m. The structure corresponding to FIG. 2A does not include a patterned ground shield, whereas the structure corresponding to FIG. 2B does. In FIG. 2A, the curve 311 stands for the inductance values (in nH) of the first inductor and the second inductor, with the inductance curves of the two inductors substantially overlapped. The curve 312 and the curve 313 respectively represent the quality factors (Q) of the first inductor and the second inductor. Similarly, in FIG. 2B, the curve 314 stands for the inductance values (in nH) of the first inductor and the second inductor, with the inductance curves of the two inductors substantially overlapped. The curve 315 and the curve 316 respectively represent the quality factors (Q) of the first inductor and the second inductor. As expected, the inductance value and the quality factor (Q) have better performances in the case where the patterned ground shield is present. In addition, it is further shown that, with the aforementioned transformer structure, the first inductor and the second inductor have substantially equal inductance values and almost identical quality factors (Q).

In brief, although the first metal layer and the second metal layer in the semiconductor structure usually have different resistance values, and the inner coil and the outer coil of the helical coil may encounter different physical characteristics, the inductance values and quality factors (Q) of the first inductor and the second inductor are almost the same because the first inductor and the second inductor are evenly distributed in the first metal layer and the second metal layer and in the inner coil and the outer coil of the helical coil; therefore an excellent symmetry can be achieved.

Figure 3A:
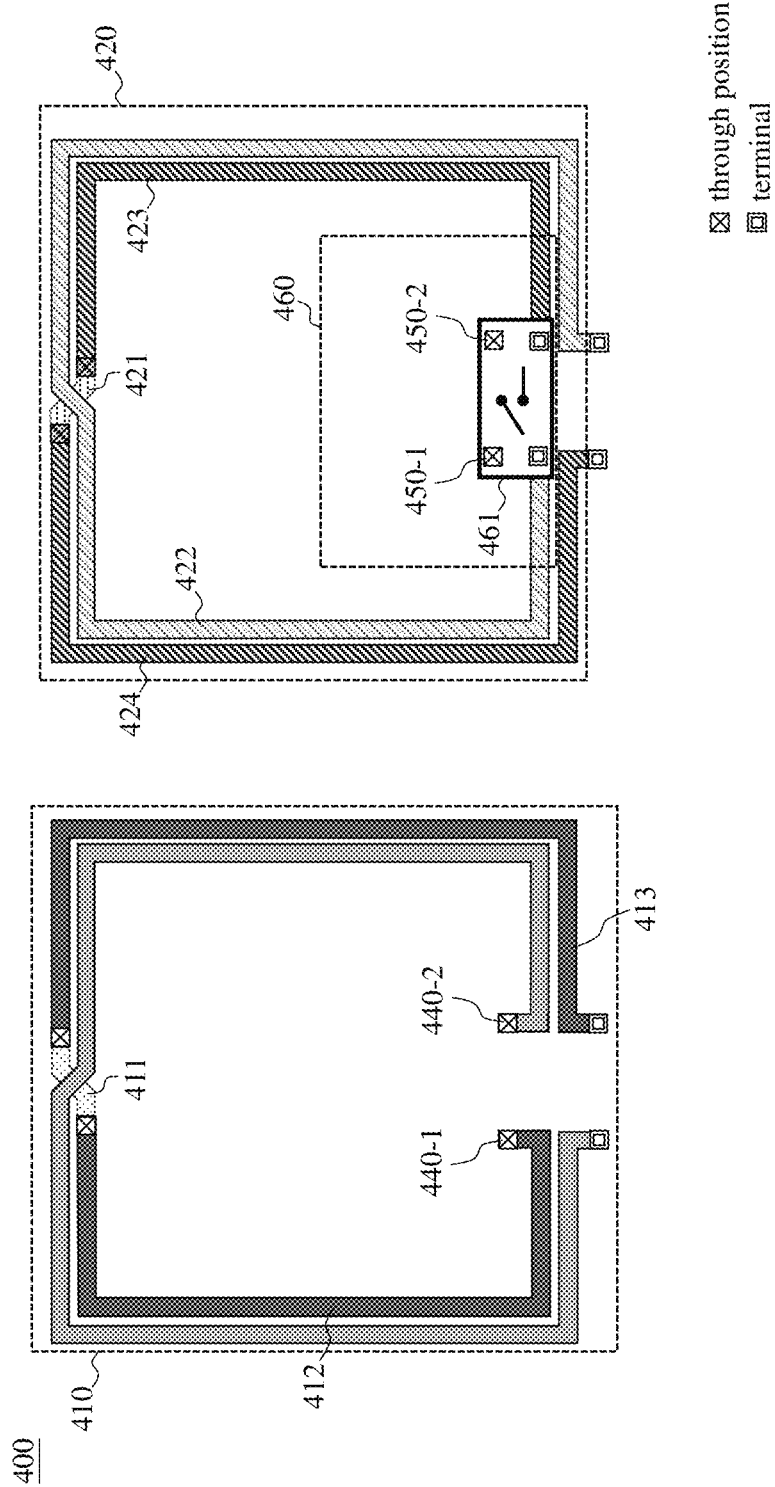
FIGS. 3A and 3B illustrate structures of the helical stacked integrated transformer according to another embodiment of this invention.
Figure 3B:
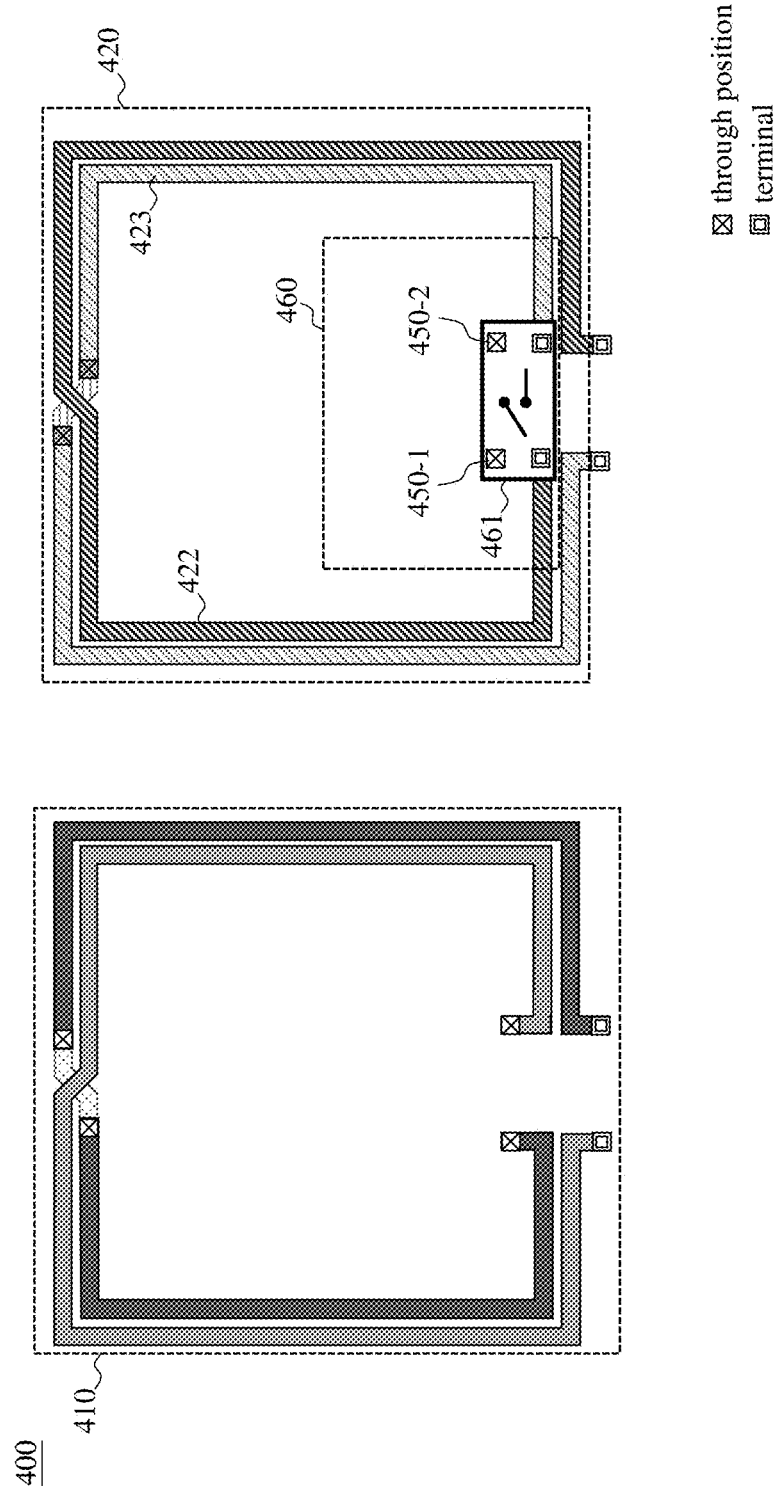

FIG. 3A and FIG. 3B illustrate structures of the helical stacked integrated transformer according to another embodiment of this invention. The helical stacked integrated transformer 400 includes the helical coil 410 and the helical coil 420, with the opening of the helical coil 410 and the opening of the helical coil 420 facing the same direction. The metal segment 411, which is implemented in a fourth metal layer, connects the metal segment 412 and the metal segment 413. The metal segment 421, which is implemented in the third metal layer, connects the metal segment 424 and the metal segment 423. The connecting structure 460 of this embodiment is located within the overlapped region of the helical coil 410 and the helical coil 420 as well, and includes a switch module 461. The switch module 461 connects one terminal of each of the metal segment 422 and the metal segment 423 with the through position 450-1 and the through position 450-2. The through position 450-1 and the through position 450-2 correspond respectively to the through position 440-1 and the through position 440-2. Similarly, the switch module 461 is able to determine the connections of the through position 450-1 and the through position 450-2 with the terminal of the metal segment 422 and the terminal of the metal segment 423 by altering the switching states of multiple switching units provided therein. In FIG. 3A, the terminal of the metal segment 422 is connected with the through position 450-2, and the terminal of the metal segment 423 is connected with the through position 450-1. As a result, the first inductor includes the left half of the outer coil and the right half of the inner coil of the helical coil 410 as well as the right half of the outer coil and the left half of the inner coil of the helical coil 420 (i.e., the metal segments in light grey); the second inductor includes the right half of the outer coil and the left half of the inner coil of the helical coil 410 as well as the left half of the outer coil and the right half of the inner coil of the helical coil 420 (i.e., the metal segments in dark grey).

FIG. 3B shows an alternative switching state of the helical stacked integrated transformer 400: the terminal of the metal segment 422 is connected with the through position 450-1 and the terminal of the metal segment 423 is connected with the through position 450-2. As a result, the first inductor includes the left half of the outer coil and the right half of the inner coil of the helical coil 410 as well as the left half of the outer coil and the right half of the inner coil of the helical coil 420 (i.e., the metal segments in light grey); the second inductor includes the right half of the outer coil and the left half of the inner coil of the helical coil 410 as well as the right half of the outer coil and the left half of the inner coil of the helical coil 420 (i.e., the metal segments in dark grey). When the configurations of the first inductor and the second inductor change, the current directions and the self-inductance and the mutual inductance of the two inductors also change; therefore, the inductance values of the two inductors can be adjusted accordingly.

Figure 4:
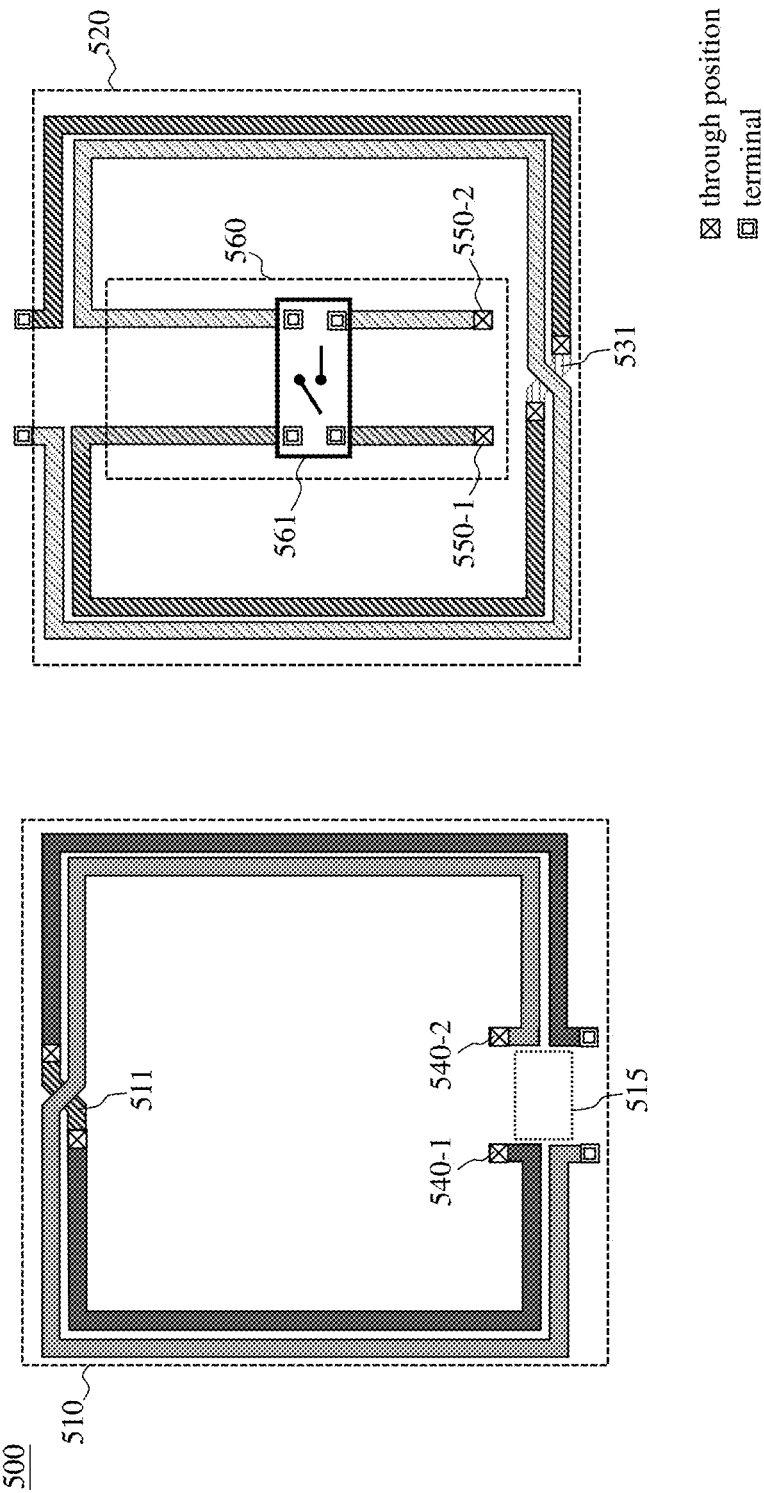
FIG. 4 illustrates a structure of the helical stacked integrated transformer according to another embodiment of this invention.

FIG. 4 illustrates a structure of the helical stacked integrated transformer according to another embodiment of this invention. The helical stacked integrated transformer 500 includes the helical coil 510 and the helical coil 520. The opening of the helical coil 510 and the opening of the helical coil 520 face opposite directions, i.e., the openings of the two helical coils differ by 180 degrees. Although being in the second metal layer, the metal segment 511 is a part of the helical coil 510. Thus, a large part of the helical coil 510 is implemented in the first metal layer while a small part is implemented in the second metal layer. Similarly, although being in the third metal layer, the metal segment 531 is a part of the helical coil 520. Thus, a large part of the helical coil 520 is implemented in the second metal layer while a small part is implemented in the third metal layer. The through position 540-1 and the through position 540-2 correspond to the through position 550-1 and the through position 550-2, respectively. The connecting structure 560 is located within the overlapped region of the helical coil 510 and the helical coil 520, and includes multiple metal segments and the switch module 561. The configurations of the first inductor and the second inductor are changed by altering the switching state of the switch module 561. In FIG. 4, the metal segments in light grey constitute the first inductor and those in dark grey constitute the second inductor. Note that although the metal segment 531 is implemented in the third metal layer in this embodiment, it can also be implemented in the first metal layer to reduce the number of metal layers used by the helical stacked integrated transformer 500 since there is no metal segment at a corresponding position in the first metal layer (as indicated by the region 515).

Figure 5:
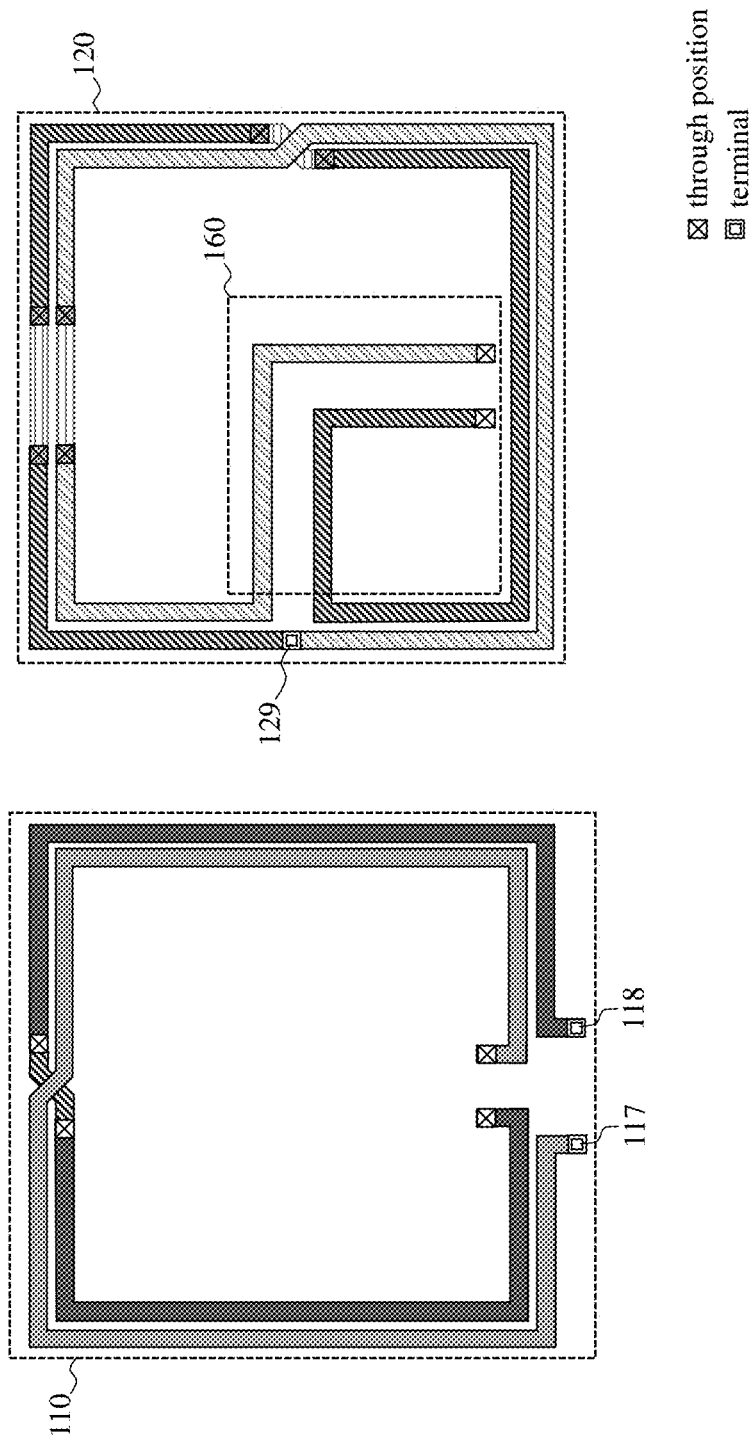
FIG. 5 illustrates a structure of the helical stacked integrated inductor according to an embodiment of this invention.

In addition to the helical stacked integrated transformer, this invention further discloses a helical stacked integrated inductor. From any helical stacked integrated transformer structure disclosed above, a helical stacked integrated inductor can be obtained if the two terminals of one of the helical coils are connected. Taking the helical stacked integrated transformer 100 of FIG. 1A as an example, after the terminal 127 and the terminal 128 of the helical coil 120 are connected, the structure in FIG. 5 can be obtained. The newly formed terminal 129 can be used as a center tap of the inductor. The center tap can be connected to a voltage source of a circuit where the helical stacked integrated inductor is incorporated or to the ground. More specifically, the integrated inductor includes two inductive units and uses the center tap as its center of symmetry. The first inductive unit that includes the metal segments in light grey employs the terminal 117 and the terminal 129 as its two terminals, and the second inductive unit that includes the metal segments in dark grey employs the terminal 118 and the terminal 129 as its two terminals According to the analysis on the helical stacked integrated transformer, the first inductive unit and the second inductive unit based on this structure have excellent symmetry, and are thus suitable for passive components in an integrated circuit. The above method can be applied to the helical stacked integrated transformer 200, the helical stacked integrated transformer 300, the helical stacked integrated transformer 400 and the helical stacked integrated transformer 500 to form a helical stacked integrated inductor.

Figure 6A:
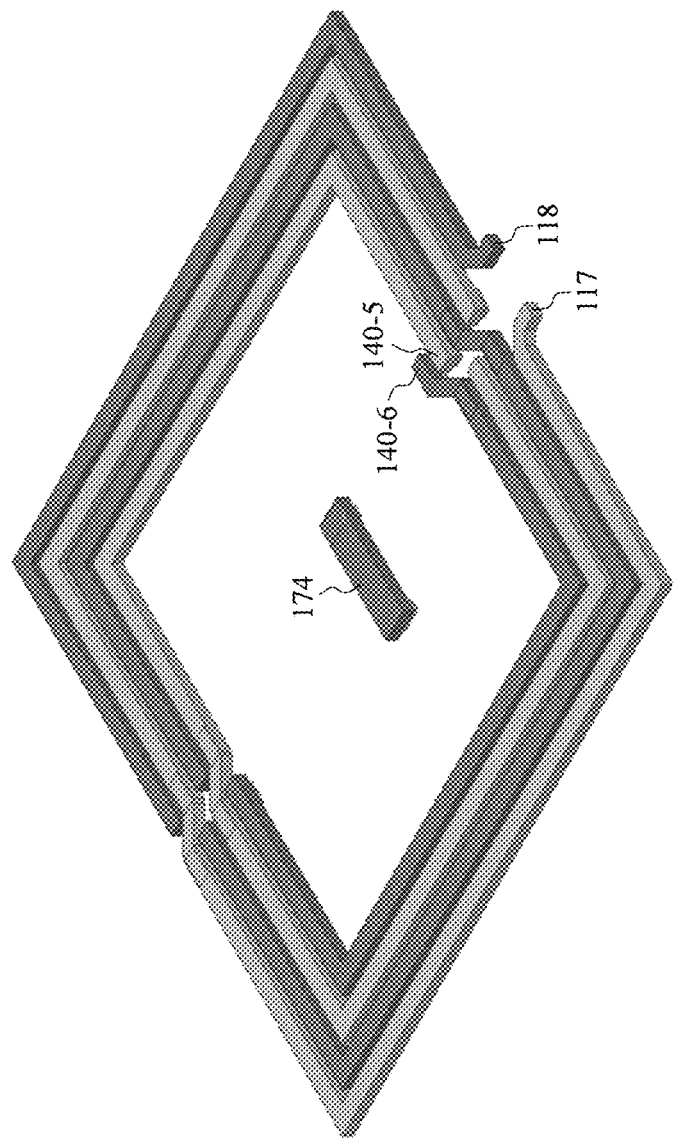
FIGS. 6A-6C illustrate a three-dimensional (3D) structure of the helical stacked integrated transformer according to another embodiment of this invention.
Figure 6B:
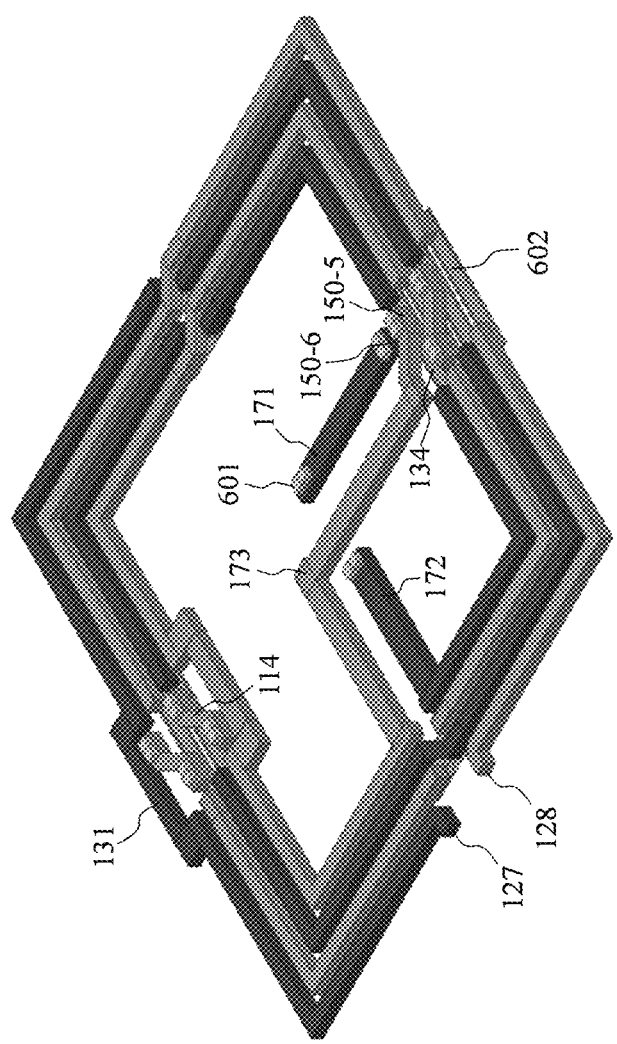
Figure 6C:
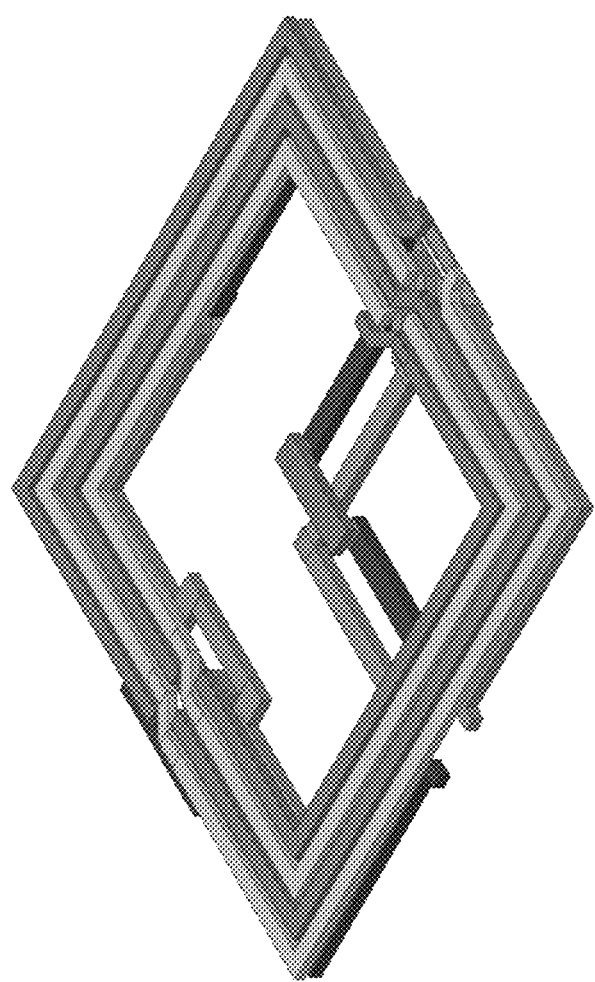

Note that the helical stacked integrated transformer or the helical stacked integrated inductor of this invention is not limited to the two-turn structures exemplified in the above embodiments. In practice, any helical coil can be implemented in more turns. FIGS. 6A~6C illustrate a three-dimensional (3D) structure of the helical stacked integrated transformer according to another embodiment of this invention. FIG. 6A depicts the metal segments implemented in the first metal layer; FIG. 6B depicts the metal segments implemented in the second metal layer and the third metal layer; FIG. 6C depicts the two metal layers, which are stacked. In this structure, the metal segments implemented in the third metal layer are illustrated by flat segments in FIG. 6B, such as the metal segment 134. A cross reference to this structure and the helical stacked integrated transformer 200 shown in FIG. 1B facilitates the understanding of this invention, despite the fact that the two helical coils are both implemented in four turns. Corresponding elements have identical denotations. The metal segment 131 in FIG. 1B is implemented in the second metal layer in FIG. 6B. The through structure 601 connects the metal segments at its corresponding through positions and can be implemented by a via structure or a via array. If a silicon layer is sandwiched by the two metal layers connected by the through structure 601, the through structure 601 would be a through silicon via (TSV). If the through structures are removed, the metal segments in the first metal layer and the metal segments in the second metal layer are not connected. The helical stacked integrated transformer and helical stacked integrated inductor of this invention are not limited to a rectangular structure but may be implemented as other polygons. Although the metal segment 602 is implemented in the third metal layer in FIG. 6B, it can be made in the second metal layer as well, as shown in FIGS. 1A and 1B.

The shape, size, and ratio of any element and the step sequence of any flow chart in the disclosed figures are exemplary for understanding, not for limiting the scope of this invention. The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A helical stacked integrated transformer, formed by a first inductor and a second inductor, comprising:
   a first helical coil, comprising a first outer coil and a first inner coil, said first inner coil being located inside said first outer coil;
   a second helical coil, sharing an overlapped region with said first helical coil, comprising a second outer coil and a second inner coil, said second inner coil being located inside said second outer coil; and
   a connecting structure, connecting said first helical coil and said second helical coil;
   wherein, said first inductor comprises a part of said first helical coil and a part of said second helical coil, and said second inductor comprises a part of said first helical coil and a part of said second helical coil;
   wherein said first helical coil is substantially located in a first metal layer of a semiconductor structure, said second helical coil is substantially located in a second metal layer of said semiconductor structure, and said connecting structure comprises a first metal segment and a second metal segment which do not form a continuous segment and are located in one of said first metal layer and said second metal layer.

2. The helical stacked integrated transformer of claim 1, wherein said connecting structure connects said first inner coil and said second inner coil.

3. The helical stacked integrated transformer of claim 1, wherein said first inductor comprises a part of said first outer coil, a part of said first inner coil, a part of said second outer coil and a part of said second inner coil, and said second inductor comprises a part of said first outer coil, a part of said first inner coil, a part of said second outer coil and a part of said second inner coil.

4. A helical stacked integrated inductor, formed by a first inductive unit and a second inductive unit, comprising:
   a first helical coil, comprising a first outer coil and a first inner coil, wherein said first inner coil is located inside said first outer coil and comprises a first terminal and a second terminal;
   a second helical coil, sharing an overlapped region with said first helical coil, comprising a second outer coil and a second inner coil, wherein said second inner coil is located inside said second outer coil, and comprises a third terminal; and
   a connecting structure, connecting said first helical coil and said second helical coil;
   wherein, said first inductive unit comprises a part of said first helical coil and a part of said second helical coil and utilizes said first terminal and said third terminal as its two terminals, and said second inductive unit comprises a part of said first helical coil and a part of said second helical coil and utilizes said second terminal and said third terminal as its two terminals;
   wherein said first helical coil is substantially located in a first metal layer of a semiconductor structure, said second helical coil is substantially located in a second metal layer of said semiconductor structure, and said connecting structure comprises a plurality of metal segments located in said first metal layer and said second metal layer.

5. The helical stacked integrated inductor of claim 4, wherein said connecting structure connects said first inner coil and said second inner coil.

6. The helical stacked integrated inductor of claim 4, wherein said first inductive unit comprises a part of said first outer coil, a part of said first inner coil, a part of said second outer coil and a part of said second inner coil, and said second inductive unit comprises a part of said first outer coil, a part of said first inner coil, a part of said second outer coil and a part of said second inner coil.

7. A helical stacked integrated transformer, formed by a first inductor and a second inductor, comprising:
   a first helical coil, comprising a first outer coil and a first inner coil, said first inner coil being located inside said first outer coil;
   a second helical coil, sharing an overlapped region with said first helical coil, comprising a second outer coil and a second inner coil, said second inner coil being located inside said second outer coil; and
   a connecting structure, connecting said first helical coil and said second helical coil;
   wherein, said first inductor comprises a part of said first helical coil and a part of said second helical coil, and said second inductor comprises a part of said first helical coil and a part of said second helical coil;
   wherein said connecting structure comprises a switch module, said switch module has a first switching state and a second switching state, and when said switch module is in said first switching state, said first inductor comprises a first portion of said second helical coil, and when said switch module is in said second switching state, said first inductor comprises a second portion of said second helical coil.

8. The helical stacked integrated transformer of claim 7, wherein said first portion and said second portion constitutes said second helical coil.

9. The helical stacked integrated transformer of claim 7, wherein said switch module is formed by a plurality of transistors.

10. The helical stacked integrated transformer of claim 7, wherein said connecting structure connects said first inner coil and said second inner coil.

11. The helical stacked integrated transformer of claim 7, wherein said first helical coil is substantially located in a first metal layer of a semiconductor structure, and said second helical coil is substantially located in a second metal layer of said semiconductor structure.

12. The helical stacked integrated transformer of claim 7, wherein said first inductor comprises a part of said first outer coil, a part of said first inner coil, a part of said second outer coil and a part of said second inner coil, and said second inductor comprises a part of said first outer coil, a part of said first inner coil, a part of said second outer coil and a part of said second inner coil.

* * * * *